US006720238B2

United States Patent
Dietrich et al.

(10) Patent No.: US 6,720,238 B2
(45) Date of Patent: Apr. 13, 2004

(54) METHOD FOR MANUFACTURING BURIED AREAS

(75) Inventors: Harry Dietrich, Kirchardt (DE); Volker Dudek, Korntal-Muenchingen (DE); Andreas Schueppen, Lauffen (DE)

(73) Assignee: ATMEL Germany GmbH, Heilbronn (DE)

( * ) Notice: Subject to any disclaimer, the term of this patent is extended or adjusted under 35 U.S.C. 154(b) by 0 days.

(21) Appl. No.: 10/145,013

(22) Filed: May 13, 2002

(65) Prior Publication Data

US 2002/0173118 A1 Nov. 21, 2002

(30) Foreign Application Priority Data

May 16, 2001 (DE) .......................... 101 24 038

(51) Int. Cl.$^7$ .............................. H01L 27/12
(52) U.S. Cl. ...................................... 438/458
(58) Field of Search ...................... 438/455–459

(56) References Cited

U.S. PATENT DOCUMENTS

| | | |
|---|---|---|
| 3,974,006 A | 8/1976 | Rodriguez |
| 5,234,535 A | 8/1993 | Beyer et al. ............. 438/459 |
| 5,453,394 A | 9/1995 | Yonehara et al. ......... 438/455 |
| 5,583,059 A | 12/1996 | Burghartz |
| 5,821,149 A | 10/1998 | Schueppen et al. |
| 5,882,987 A | 3/1999 | Srikrishnan ............. 438/458 |
| 6,057,212 A | 5/2000 | Chan et al. ............. 438/455 |
| 6,091,112 A | 7/2000 | Kwon ..................... 257/347 |
| 6,103,009 A | 8/2000 | Atoji ..................... 117/97 |
| 6,146,979 A | 11/2000 | Henley et al. |
| 6,413,874 B1 | 7/2002 | Sato |
| 2002/0173086 A1 * | 11/2002 | Dietrich et al. ......... 438/459 |
| 2002/0173119 A1 | 11/2002 | Dietrich et al. |

FOREIGN PATENT DOCUMENTS

| | | |
|---|---|---|
| DE | 2535813 | 11/1976 |
| DE | 19609933 | 9/1997 |
| DE | 19757269 | 7/1998 |
| EP | 0996150 | 4/2000 |
| EP | 1045448 | 10/2000 |

OTHER PUBLICATIONS

Witek P. Maszara, "SOI by Wafer Bonding: A Review"; Electrochem. S c. PV 90–6; 1990; pp. 199 to 212B.
S. B. Goody, "High Speed Bipolar on Bonded Buried Silicide SOI (S$^2$OI)", ESSDERC, 1998, pp. 500 to 503.
H. S. Gamble; "Polish Stop Technology for Silicon on Silicide on Insulator Structures" by H. S. Gamble; "Perspectives, Science and Technologies for Novel Silicon on Insulator Devices," 2000, pp. 17 to 28.

* cited by examiner

Primary Examiner—Wael Fahmy
Assistant Examiner—Anh Duy Mai
(74) Attorney, Agent, or Firm—W. F. Fasse; W. G. Fasse

(57) ABSTRACT

A manufactured multi-layered silicon wafer with a buried insulating layer and buried areas with different parameters is formed by bonding together a first wafer and a second wafer. Before the bonding, areas with modified layer parameters, which will be buried by bonding with the second wafer, are created on the surface of the first wafer, which also has an insulating intermediate layer. A further insulating layer is then applied, and the surface of the first wafer is bonded to the surface of the second wafer. The substrate layer and the insulating intermediate layer of the first wafer are subsequently removed. This eliminates the conventional thinning of the second wafer. In addition, areas with vertical gradients can be created in the layer parameters without processing the second wafer.

23 Claims, 2 Drawing Sheets

METHOD FOR MANUFACTURING BURIED AREAS

CROSS-REFERENCE TO RELATED APPLICATIONS

This application is related to U.S. application Ser. No. 10/145,169, filed on May 13, 2002; and U.S. application Ser. No. 10/145,172, filed on May 13, 2002.

BACKGROUND

1. Field of the Invention

The present invention relates to a method for manufacturing buried areas on a wafer with an insulating intermediate layer.

2. Description of the Related Technology

Such a method is known from the publication by H. S. Gamble, in Perspectives, Science and Technologies for Novel Silicon on Insulator Devices, 2000. Starting from a wafer which has a complete oxide layer covered by a complete silicide layer, a wafer with a buried suicide layer with an insulating intermediate layer lying underneath that (SOI wafer) is produced by bonding the surface of the silicide layer with the surface of another silicon wafer by means of wafer bonding. After bonding the surfaces, the silicon wafer is thinned by means of further process steps in order to create a silicon layer in which components can be manufactured by further process steps. In order to structure the silicide layer and to create individual silicon areas (boxes) which are isolated from one another, the thinned silicon layer and the underlying silicide layer are etched through by means of a trench process. The trench process stops at the oxide layer lying underneath the silicide layer.

The disadvantage of the method described is that a complete silicide layer has to be buried on an SOI wafer, this silicide layer has to be structured by a trench process, during which, among other things, metallic ions are released, the slightest traces of which impair the properties of the components. This cannot be achieved with reasonable expenditure, particularly if the uppermost silicon layer is somewhat thick. Moreover, undesired parasitic capacitances, which severely impede the use of the SOI wafer for the manufacture of integrated circuits, form on contact surfaces and certain components, such as for example MOS transistors. Moreover, the difference between the coefficient of expansion of the silicide layer and that of the substrate material leads to distortions which, depending upon the temperature process, warp the SOI wafer or create offsets in the active silicon layer. In addition, warped wafers cause substantial expenditure in the lithography modules. Furthermore, it is difficult to manufacture a collector for a vertical, bipolar transistor with this method, as this also requires the silicon wafer used for bonding to be processed before being bonded. A further disadvantage is that tight tolerances on the layer thickness of the uppermost silicon layer can only be maintained with great effort when grinding back the wafer. Moreover, time-consuming cleaning and polishing steps are required after grinding in order to obtain an acceptable surface quality.

AS SOI wafers offer substantial advantages in comparison to conventional silicon substrates for the manufacture of integrated circuits, such as for example the complete suppression of substrate currents and, provided that there are no complete buried metal layers, the lowest parasitic capacitances, wafers with an insulating intermediate layer are increasingly being used as the starting material for the production of integrated circuits in the field of semiconductor technology. Moreover, individual component boxes which are completely isolated from one another can be manufactured on SOI wafers by means of a trench technology, these boxes may lie on a different electrical potential. In order to combine specific component properties on one SOI wafer, one of the objectives of the development in this field is to achieve extremely low connection resistances for specific types of components by means of burying spatially bounded layers, hereinafter referred to as areas, such as for example silicides, whereas very small parasitic capacitances of the insulating intermediate layer are achieved for other types of components.

SUMMARY OF THE INVENTION

The object of the present invention is to provide a method with which buried areas can be easily and economically manufactured on a wafer with an insulating intermediate layer.

This object has been achieved according to the invention in a method for fabricating a manufactured multi-layered silicon wafer by bonding together a first silicon wafer and a second silicon wafer.

According to this, the essence of the invention consists of starting with a wafer which has an insulating intermediate layer, and creating areas with at least one changed layer parameter on or within the uppermost silicon layer, and to bury these areas by a subsequent step. For this purpose, a silicon wafer with an insulating intermediate layer is created, starting from a first silicon wafer comprising a surface layer on top of an insulating intermediate layer arranged on a substrate and a second silicon wafer with a surface, by bonding the respective surfaces of the two wafers and, before bonding, areas with modified layer properties are created on the first wafer within or on the surface of the surface layer which differ from the regions surrounding these areas in at least one characteristic layer property, and at least one insulating layer is subsequently applied to the surface of at least one silicon wafer, and the substrate of the first silicon wafer is removed after bonding. In a development of the method, it is advantageous to remove the substrate of the first silicon wafer selectively to the insulating intermediate layer, as selective removal can be performed by robust and comparably inexpensive process steps, such as for example by a wet chemical process. In a subsequent process step, the insulating intermediate layer of the first wafer, the previous boundary surface of the silicon/insulating layers, which was buried before the bonding, is made available as a new silicon surface by the removal, which can also take place area by area and/or step by step. Provided that the insulating intermediate layer has only been removed in certain areas, this can also be used for further process steps, for example as a mask.

An advantage of the new method in comparison to the previous state-of-the-art is that the parameters of individual areas in the uppermost silicon layer on the first wafer can be optimized for the particular type of components before bonding, without changing the parameters of the whole layer. Moreover, the surface of the first silicon layer, which has a high quality from the manufacture of the first wafer, can be made usable for further manufacturing steps with which, for example, components of integrated circuits are made without needing after-treatment of the uppermost silicon layer in order to optimize the layer quality. The new method does not depend upon the thickness of the first layer on the first silicon wafer. Particularly in the case of thicker layers, the demands upon the quality of the surface, such as for example the evenness of the layer thickness, are reduced as an insulating layer is deposited on this surface, and the surface is buried as a silicon/insulating layer boundary layer by the renewed bonding with another wafer. The demands upon the structure and quality of this layer are low as the substrate and the insulating layer of the first wafer are removed. Moreover, with the selective removal of the substrate, the intermediate layer merely serves as a stop layer, and the thickness of the insulating layer may be correspondingly thin, for example less than 0.1 $\mu$m. The thermal load and stress from the oxidation are reduced to the greatest possible extent by the low demands upon the manufacturing process of the first wafer.

In a development of the method, the conductivity is changed in defined areas of the uppermost silicon layer of the first wafer by, for example, implanting and/or diffusing a doping substance before bonding the two wafers. This enables the electrical properties of the collector regions to be adapted, particularly for bipolar transistors. Moreover, the layer thickness of the silicon layer can be locally or globally increased by means of an epitaxy process in order to create a vertical doping gradient. The electrical properties can be optimized by the combination of the various process steps, particularly in the bipolar area.

In another development of the method, silicided areas are created in the uppermost silicon layer of the first wafer before bonding in order to achieve a particularly low layer resistance. As well as the formation of a titanium or nickel suicide, the formation of a cobalt silicide is preferable as this has a particularly high temperature stability In this connection, it is advantageous to protect the areas of the layer in which silicide is not to be formed by an oxide mask, and to match the thickness of the oxide layer to the final thickness of the suicide in such a manner that the oxide layer forms a planar surface with the silicide layer.

In another development of the method, the silicide layer is covered by an oxide layer in order to make bonding with the second wafer easier. If necessary, adequate planarity of the covering oxide layer can be produced by means of a brief polishing step, e.g. a chemical mechanical polishing (CMP) step. The oxide layer, the thickness of which is, for example, more than 0.5 $\mu$m, is preferably created by deposition in order to keep the thermal budget low. In so doing, it is advantageous to use the oxide layer as an insulating intermediate layer after bonding, and to match its thickness to the component properties.

BRIEF DESCRIPTION OF THE FIGURES

The method according to the invention is described in the following by means of an embodiment in conjunction with a sequence of drawings. They show.

DESCRIPTION OF THE PREFERRED EMBODIMENTS

The sequence of process steps shown in FIGS. 1a–e illustrates the manufacturing process for a wafer 100 with an insulating intermediate layer 405 of silicon oxide (SOI wafer) which has buried silicided areas 414. The complete intermediate layer 405 electrically insulates the uppermost, monocrystalline silicon layer from the substrate material 410, whereby the thickness of the uppermost silicon layer and the insulating intermediate layer 405 are selected appropriately for the subsequent application, and preferably lie in the range of a few $\mu$m. Such SOI wafers are used, for example, as the starting material for the manufacture of current-free substrate, integrated circuits, in which different types of components can be integrated on one SOI wafer. The manufacturing process is explained in detail in the following.

Figure 1A:
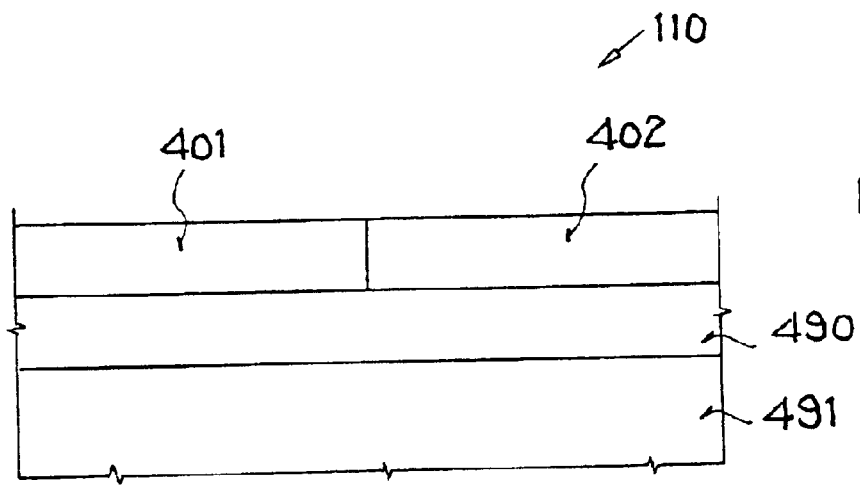
FIGS. 1a–e A diagrammatic sequence of a manufacturing process for a silicon wafer which has an insulating intermediate layer and upon this subsequently buried silicided areas.
Figure 1B:
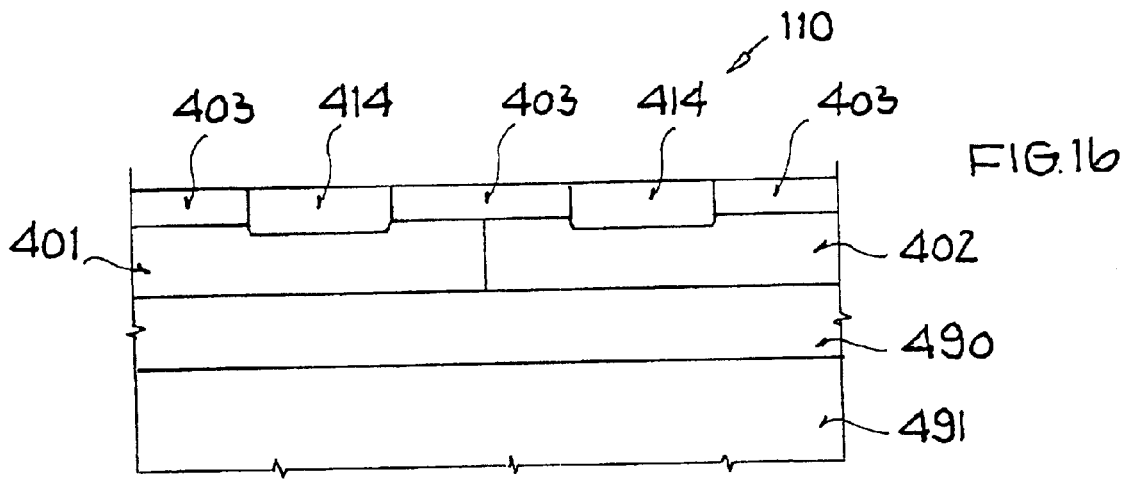
Figure 1C:
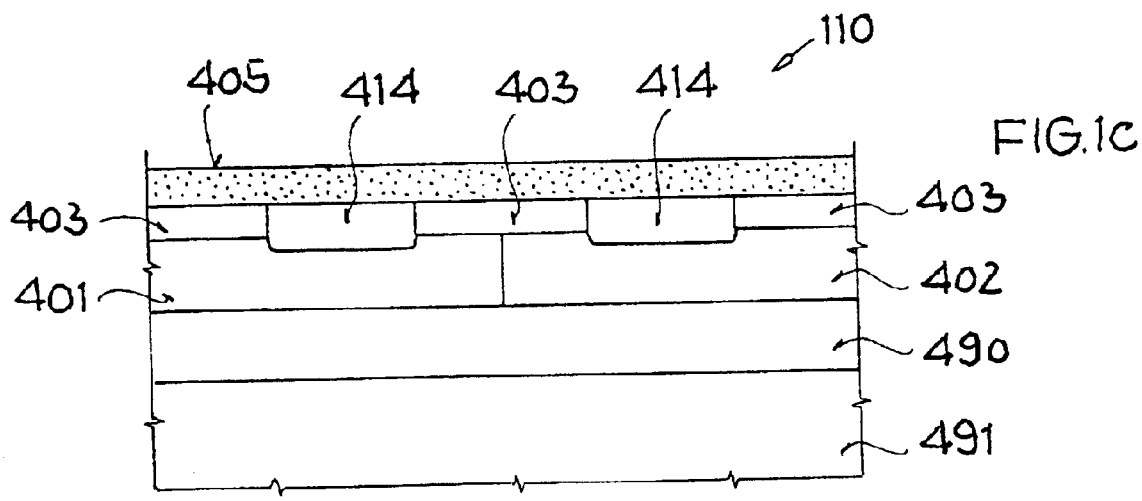

FIG. 1a shows a cross-section of a first SOI wafer 110. The SOI wafer 110 has a silicon substrate 491 upon which is an oxide layer 490 as an insulating layer, the thickness of which preferably lies between 0.1 $\mu$m and 2.0 $\mu$m, on top of the oxide layer 490, there is a silicon layer which is subdivided by means of an implantation into a first area 401 with a first conductivity and a second area 402 with a second conductivity. In a subsequent step, shown in FIG. 1b, a complete oxide layer 403 is applied to the surface of the SOI wafer 110, in which holes are etched by means of a mask step, a silicide 414 is produced in these holes in a subsequent process step. In so doing, the thickness of the oxide layer 403 is chosen so that it forms a planar surface with the silicided areas 414. In a subsequent process step, shown in FIG. 1c, an oxide layer 405 is applied by means of a deposition process, the thickness of which preferably lies in the range above 0.1 $\mu$m. The exact thickness of the oxide is determined by the type of subsequent application.

Figure 1D:
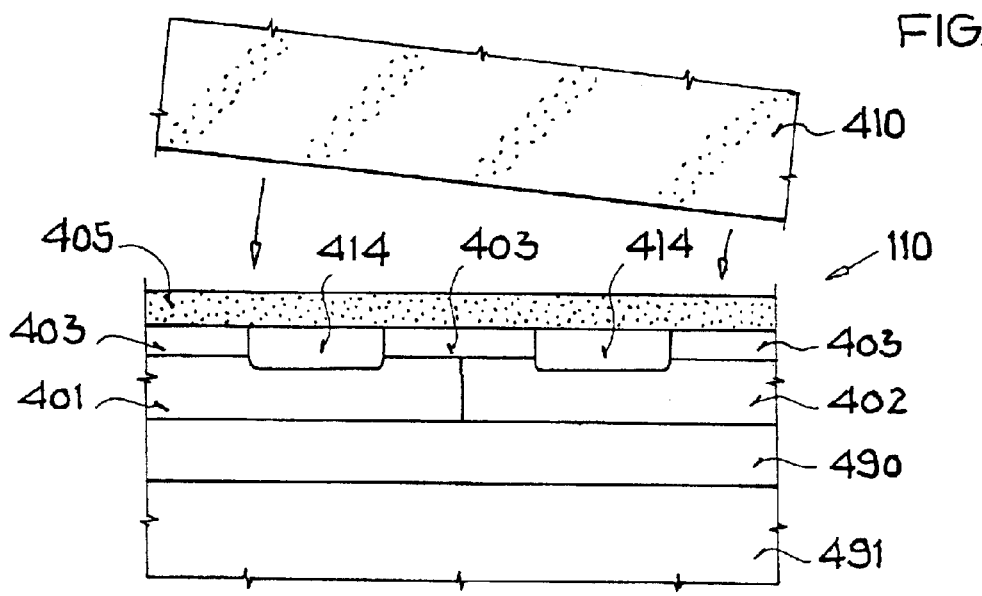

In a subsequent process step, shown in FIG. 1d, the surface of the SOI wafer 110 is bonded to the surface of a second wafer 410, which does not have an insulating oxide layer for reasons of cost. An important prerequisite for this is that the surfaces of the two wafers 110, 410 are as planar as possible, i.e. neither concavely nor convexly warped. This can be achieved by carrying out a chemical mechanical polishing (CMP) step, if necessary, on the oxide layer 405.

Figure 1E:
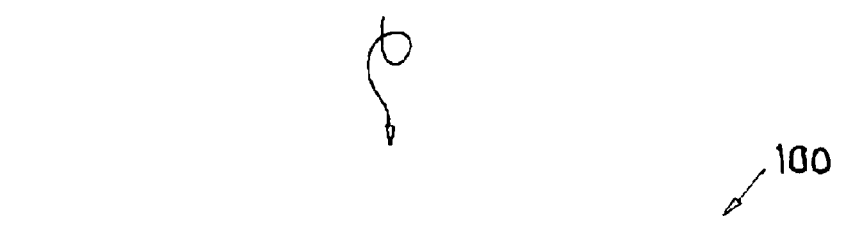
Figure 1E:
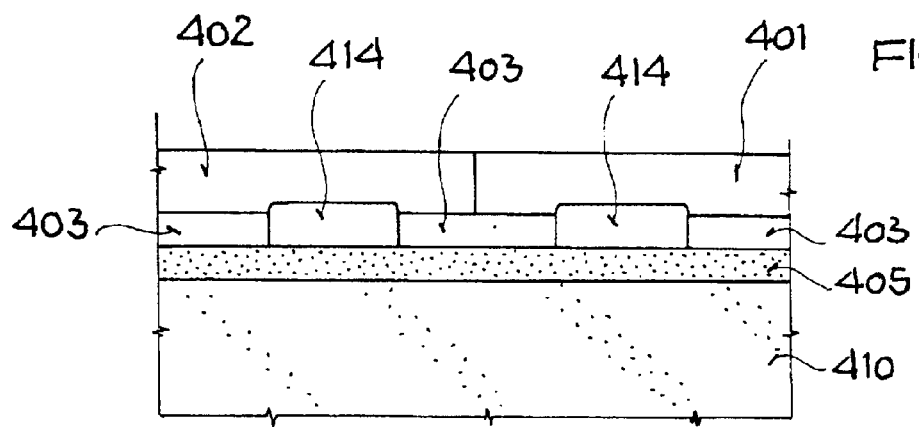

The cross-section of the finished SOI wafer 100 is shown in FIG. 1e, in which the substrate 491 and the oxide layer 490 of the first SOI wafer 110 have been removed. The substrate 491 is preferably removed by a combination of a chemical mechanical polishing step and a wet chemical etching step, in which there is selectivity in the etching rate of the silicon and oxide in the wet chemical process step.

With the method according to the invention, areas with various layer properties, such as for example doping, siliciding etc., can be advantageously created on or within a layer by standardized production processes within a manufacturing process for integrated circuits. In this way, the parameters of the individual areas can be optimized for the components which are to be manufactured. The areas are buried by the subsequent bonding of the surface of the first wafer 110 to the surface of the second silicon wafer 410, during which, for example, buried vertical profiles are produced in the individual areas. The desired layer properties are thus only produced at the defined places on the SOI wafer 100. Time-consuming trench processes for cutting through silicide layers are not required. Furthermore, the clean and defect-free surface of the first wafer 110 is made available as the starting surface for subsequent manufacturing processes. Additional after-treatment steps in order to achieve an adequate surface quality are not required. In addition, instead of a single oxide layer 401, various layer structures, for example combinations of nitride, polysilicon and oxide layers, can be created which together form an insulating intermediate layer. Furthermore, the method may also be used for other silicon wafers which do not have insulating intermediate layers.

What is claimed is:

1. A method of manufacturing a multi-layered wafer, comprising the steps:

a) providing a first initial wafer (110) comprising silicon and including a first substrate (491) and a first surface layer (401, 402) directly or indirectly on said first substrate;

b) providing a second initial wafer (410) comprising silicon, and including a second substrate;

c) in and/or on said first surface layer of said first initial wafer, forming at least one layer area (414) surrounded laterally by at least one layer region (403), wherein said at least one layer area respectively has a characteristic layer property thereof different from said at least one layer region;

d) forming at least one insulating layer (405) on at least one of an exposed surface of said second initial wafer after said step b) and an exposed surface of said first initial wafer after said step c);

e) after said step d), bonding together said first initial wafer and said second initial wafer along a new outer surface of said at least one insulating layer (405);

f) after said step e), removing said first substrate (491) of said first initial wafer, to leave said multi-layered wafer including said first surface layer (401, 402), said at least one layer area (414) surrounded laterally by said at least one layer region (403), at least one part of said second initial wafer (410), and said at least one insulating layer (405) so between said at least one layer area (414) surrounded laterally by said at least one layer region (403) and said at least one part of said second initial wafer (410).

2. The method according to claim wherein said at least one part of said second initial wafer comprises said second substrate.

3. The method according to claim 1, wherein said step d) comprises forming only one said insulating layer on only one said exposed surface of only one of said first initial wafer and said second initial wafer, and the other of said first and second initial wafers does not have an insulating layer on said exposed surface thereof.

4. The method according to claim 3, wherein said step d) comprises forming said insulating layer on said exposed surface being an exposed surface of said at least one layer area and said at least one layer region of said first initial wafer.

5. The method according to claim 1, wherein said at least one layer area (414) is completely laterally surrounded by said at least one layer region (403) and is completely enclosed between said first surface layer (401, 402) and said at least one insulating layer (405) in said multi-layered wafer.

6. The method according to claim 1, wherein said step a) comprises providing said first surface layer to include a first portion (401) and a second portion (402) laterally adjacent to each other, wherein said first and second portions of said first surface layer have a characteristic property that differs relative to each other.

7. The method according to claim 6, wherein said characteristic property is a different conductivity type respectively for said first and second portions of said first surface layer.

8. The method according to claim 1, wherein said first initial wafer provided in said step a) further includes an initial insulating intermediate layer (490) between said first substrate (491) and said first surface layer (401, 402), and said removing in said step f) comprises selectively removing said first substrate (491) to said initial insulating intermediate layer (490) without removing said initial insulating intermediate layer (490).

9. The method according to claim 1, wherein said first initial wafer provided in said step a) further includes an initial insulating intermediate layer (490) between said first substrate (491) and said first surface layer (401, 402), and said removing in said step f) further comprises removing said initial insulating intermediate layer (490).

10. The method according to claim 1, wherein said first initial wafer provided in said step a) further includes an initial insulating intermediate layer (490) between said first substrate (491) and said first surface layer (401, 402), and said removing in said step f) further comprises removing at least one selected area of said initial insulating intermediate layer and leaving at least one other area of said initial insulating intermediate layer remaining in said multi-layered wafer.

11. The method according to claim 1, wherein said characteristic layer property is a conductivity, and said at least one layer area (414) has said conductivity different from said at least one layer region (403).

12. The method according to claim 1, wherein said at least one layer area formed in said step c) is at least one silicide area formed of a silicide.

13. The method according to claim 12, wherein said silicide is a cobalt silicide.

14. The method according to claim 12, wherein said silicide is a titanium silicide or a nickel silicide.

15. The method according to claim 12, wherein said at least one layer region formed in said step c) comprises an oxide layer (403) with at least one opening therein forming an oxide mask (403), and said at least one silicide area is formed in said at least one opening of said oxide mask.

16. The method according to claim 15, wherein said oxide mask and said at least one silicide area respectively have a thickness selected so that a top surface of said at least one silicide area end a top surface of said oxide mask lie flushly on a single plane.

17. The method according to claim 16, wherein said insulating layer (405) comprises an oxide and covers said top surface of said at least one silicide area and said top surface of said oxide mask.

18. The method according to claim 1, wherein said insulating layer (405) comprises an oxide and has a thickness greater than 0.5 $\mu$m, and wherein said forming of said insulating layer in said step d) comprises depositing said oxide to form said insulating layer.

19. The method according to claim 18, further comprising planarizing a surface of said insulating layer after said step d) by carrying out a chemical mechanical polishing step on said surface of said insulating layer (405).

20. The method according to claim 1, wherein said step c) comprises forming a silicon-containing layer on said first surface layer, and then doping a dopant into at least one selected area of said silicon-containing layer to form said at least one layer area while a remainder of said silicon-containing layer forms said at least one layer region.

21. The method according to claim 1, excluding all steps involving thinning said second initial wafer after said step e).

22. The method according to claim 1, excluding all steps of trenching through any one of said layers of said multi-layered wafer formed in said step f).

23. The method according to claim 1, wherein said multi-layered wafer formed in said step f) does not include any continuous complete buried metal layer.

* * * * *

UNITED STATES PATENT AND TRADEMARK OFFICE
CERTIFICATE OF CORRECTION

PATENT NO. : 6,720,238 B2
DATED : April 13, 2004
INVENTOR(S) : Dietrich et al.

It is certified that error appears in the above-identified patent and that said Letters Patent is hereby corrected as shown below:

Title page,
Item [56], References Cited, OTHER PUBLICATIONS, "Witek P. Maszara" reference, replace "S c." by -- Soc. --;

Column 1,
Line 21, after "buried" replace "suicide" by -- silicide --;

Column 5,
Line 26, after "(405)" delete "so";
Line 30, after "claim" insert -- 1 --;

Column 6,
Line 36, after "area", replace "end" by -- and --.

Signed and Sealed this

Ninth Day of November, 2004

JON W. DUDAS
*Director of the United States Patent and Trademark Office*